United States Patent
Ono et al.

(10) Patent No.: US 12,107,445 B2
(45) Date of Patent: Oct. 1, 2024

(54) POWER FEEDING CONTROL DEVICE, POWER FEEDING SYSTEM, AND POWER FEEDING METHOD

(71) Applicant: Yazaki Corporation, Tokyo (JP)

(72) Inventors: Chihiro Ono, Susono (JP); Takahiro Syouda, Susono (JP)

(73) Assignee: Yazaki Corporation, Tokyo (JP)

( * ) Notice: Subject to any disclaimer, the term of this patent is extended or adjusted under 35 U.S.C. 154(b) by 470 days.

(21) Appl. No.: 17/406,329

(22) Filed: Aug. 19, 2021

(65) Prior Publication Data

US 2022/0060030 A1 Feb. 24, 2022

(30) Foreign Application Priority Data

Aug. 19, 2020 (JP) .................................. 2020-138462

(51) Int. Cl.
*H02J 7/00* (2006.01)
*G01R 31/3828* (2019.01)
*H02J 1/10* (2006.01)

(52) U.S. Cl.
CPC ........ *H02J 7/0016* (2013.01); *G01R 31/3828* (2019.01); *H02J 1/10* (2013.01); *H02J 7/00304* (2020.01)

(58) Field of Classification Search
CPC ... G01R 19/16542; G01R 31/382; H02J 1/10; H02J 7/0016; H02J 7/0025; H02J 7/00304; H02J 7/0063; H02J 7/00714; H02J 7/007186; H02J 7/007194; H02J 7/345; H01R 31/3828
See application file for complete search history.

(56) References Cited

U.S. PATENT DOCUMENTS

2005/0212487 A1 * 9/2005 Sodeno ................. H02J 7/1446
320/132

FOREIGN PATENT DOCUMENTS

| EP | 2790292 A1 * | 10/2014 | ............... H02J 9/06 |
| JP | H08130833 A * | 5/1996 | |
| JP | 2013-031247 A | 2/2013 | |

* cited by examiner

*Primary Examiner* — Jack Chiang
*Assistant Examiner* — Aric Lin
(74) *Attorney, Agent, or Firm* — Banner & Witcoff, Ltd.

(57) ABSTRACT

A power feeding control device controls a power feeding system including a plurality of battery cells feeding power to a load, a bypass lines which connects or disconnects each of the battery cells and the load, an external power feeding unit which is connected in parallel with the load and feeds power to the load. Before the bypass line starts switching of a connection state between each of the battery cells and the load, supply voltage from the external power feeding unit to the load is increased. Further, after the bypass line switches the connection state between each of the battery cells and the load, the supply voltage from the external power feeding unit to the load is decreased.

5 Claims, 5 Drawing Sheets

POWER FEEDING CONTROL DEVICE, POWER FEEDING SYSTEM, AND POWER FEEDING METHOD

CROSS-REFERENCE TO RELATED APPLICATIONS

This application is based on and claims priority under 35 USC 119 from Japanese Patent Application No. 2020-138462 filed on Aug. 19, 2020, the contents of which are incorporated herein by reference.

TECHNICAL FIELD

The present invention relates to a power feeding control device, a power feeding system, and a power feeding control method.

BACKGROUND ART

As a discharge system that controls the discharge of a battery device in which a plurality of batteries are connected in series, a discharge system is known in which a battery which avoids discharge is selected based on a state of each battery, and then the battery which avoids the discharge is bypassed and electric power is discharged from another battery (see, for example, JP-A-2013-31247).

In a discharge system described in JP-A-2013-31247, when a battery discharged to a discharge end voltage can be selected as a battery for avoiding discharge, and then the battery can be bypassed and power can be discharged from another battery in sequence, all batteries can be discharged without leaving any discharge capacity.

However, for example, when switching a connection state of a plurality of power supplies, such as switching a bypass state of each of a plurality of battery cells connected in series or switching a connection state of a plurality of power supply systems connected in parallel and a load, from a viewpoint of preventing short circuits or the likes, it is necessary to stop power feeding from the power supply to the load.

SUMMARY OF INVENTION

The present invention is made in view of the circumstances described above and an object of the present invention is to provide a power feeding control device, a power feeding system, a power feeding control method, and a program capable of continuing power feeding to a load even when a connection state of a plurality of power supplies is switched.

A power feeding control device in the present disclosure controls a power feeding system. The power feeding system includes a plurality of power supplies feeding power to a load, a connection state switching unit which connects or disconnects each of the plurality of power supplies and the load, and an external power feeding unit which is connected in parallel with the load and feeds power to the load. Supply voltage from the external power feeding unit to the load is increased before the connection state switching unit starts switching of a connection state between each of the plurality of power supplies and the load, and the supply voltage from the external power feeding unit to the load is decreased after the connection state switching unit switches the connection state between each of the plurality of power supplies and the load.

A power feeding system in the present disclosure includes a plurality of power supplies feeding power to a load, a connection state switching unit which connects or disconnects each of the plurality of power supplies and the load, an external power feeding unit which is connected in parallel with the load and feeds power to the load, and a power feeding control device which controls power feeding from the plurality of power supplies to the load and power feeding from the external power feeding unit to the load. The power feeding control device raises supply voltage from the external power feeding unit to the load before the connection state switching unit starts switching of a connection state between each of the plurality of power supplies and the load. Further, the power feeding control device lowers the supply voltage from the external power feeding unit to the load after the connection state switching unit switches the connection state between each of the plurality of power supplies and the load.

A power feeding control method in the present disclosure is performed using a power feeding control device for controlling the power feeding system. The power feeding system includes a plurality of power supplies feeding power to a load, a connection state switching unit which connects or disconnects each of the plurality of power supplies and the load, and an external power feeding unit which is connected in parallel with the load and feeds power to the load. The power feeding control method includes the steps of increasing supply voltage from the external power feeding unit to the load before the connection state switching unit starts switching of a connection state between each of the plurality of power supplies and the load, and decreasing the supply voltage from the external power feeding unit to the load after the connection state switching unit switches the connection state between each of the plurality of power supplies and the load.

DESCRIPTION OF EMBODIMENTS

Hereinafter, the present invention will be described with reference to preferred embodiments. The present invention is not limited to the embodiments shown below and can be appropriately modified without departing from the spirit of the present invention. Further, in the embodiments shown below, some parts of the configurations are not illustrated or explained. However, it goes without saying that, as for the details of the omitted technology, publicly known or well-known technology is appropriately applied as long as there is no contradiction with the contents described below.

Figure 1:
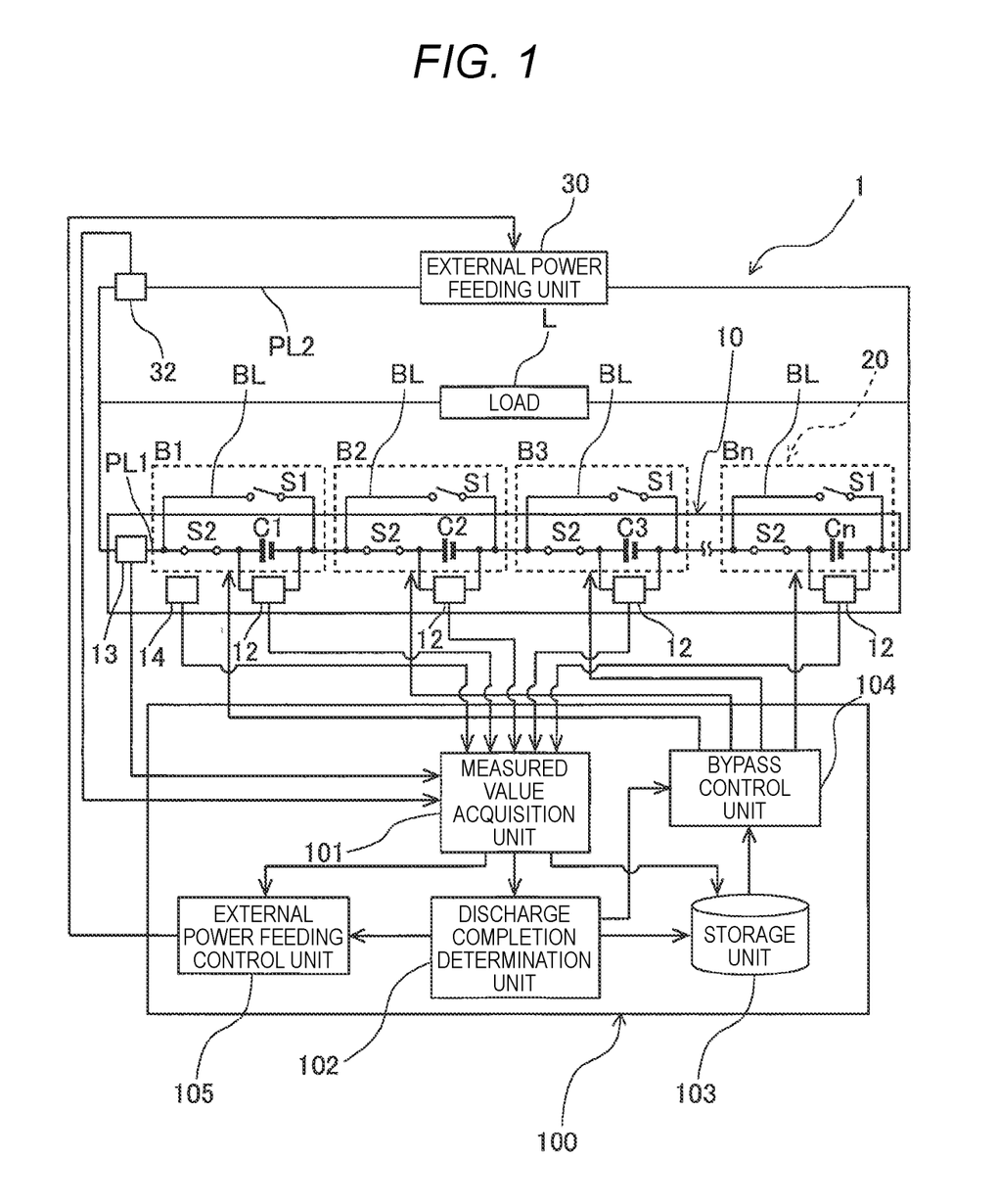
FIG. 1 is a diagram illustrating an outline of a power feeding system including a power feeding control device according to an embodiment of the present invention.

FIG. 1 is a diagram illustrating an outline of a power feeding system 1 including a power feeding control device 100 according to an embodiment of the present invention. As illustrated in the figure, the power feeding system 1 includes a power supply system 10, a bypass circuit 20, an external power feeding unit 30, and the power feeding control device 100. The power supply system 10 is an in-vehicle or stationary power supply including n (n is an integer of two or more) battery cells C1 to Cn connected in series. Although not particularly limited, the power supply system 10 of the present embodiment is obtained by reproducing a used battery and there is a difference in the degree of deterioration of each of the battery cells C1 to Cn. The battery cells C1 to Cn are, for example, secondary batteries such as a lithium ion battery and a lithium ion capacitor. The battery cells C1 to Cn are charged by being supplied with electric power from a charging circuit (not illustrated) or an external power feeding unit 30 and discharge the charged electric power to supply electric power to a load L.

The power supply system 10 includes a plurality of voltage measuring units 12, a current measuring unit 13, and a battery temperature measuring unit 14. The voltage measuring unit 12 is connected between a positive electrode terminal and a negative electrode terminal of each of the battery cells C1 to Cn. The voltage measuring unit 12 measures the voltage between terminals of each of the battery cells C1 to Cn.

The current measuring unit 13 is provided in a power line PL1 which connects the power supply system 10 and the load L. The current measuring unit 13 measures a current value Is (see FIG. 2) of supply current from the power supply system 10 to the load L. Further, the power supply system 10 is provided with the battery temperature measuring unit 14. The battery temperature measuring unit 14 measures a battery temperature of the power supply system 10.

The bypass circuit 20 includes n (n is an integer of two or more) bypass circuits B1 to Bn provided in each of the battery cells C1 to Cn. The bypass circuits B1 to Bn include a bypass line BL and switches S1 and S2. The bypass line BL is a power line which bypasses each of the battery cells C1 to Cn. The switch S1 is provided in the bypass line BL. The switch S1 is, for example, a mechanical switch. The switch S2 is provided between a positive electrode of each of the battery cells C1 to Cn and one end of the bypass line BL. The switch S2 is, for example, a semiconductor switch.

The battery cell C1 at the beginning and the battery cell Cn at the end are connected to the load L. When the switch S1 is open (OFF) and the switch S2 is closed (ON) in all bypass circuits B1 to Bn, electric power is discharged from all battery cells C1 to Cn to the load L. On the other hand, when the switch S1 is closed and the switch S2 is opened in any of the bypass circuits B1 to Bn, the battery cells C1 to Cn corresponding to the bypass circuits B1 to Bn are bypassed.

The external power feeding unit 30 is, for example, a commercial power supply, a generator, or the like and is connected in parallel with the load L. The external power feeding unit 30 supplies electric power to the load L. As will be described below, the external power feeding unit 30 supplies electric power to the load L before and after the bypass state of each of the battery cells C1 to Cn is switched by the bypass circuit 20.

The current measuring unit 32 is provided in the power line PL2 which connects the external power feeding unit 30 and the load L. The current measuring unit 32 measures the current value Io (see FIG. 2) of the supply current from the external power feeding unit 30 to the load L and outputs the current value to the power feeding control device 100.

The power feeding control device 100 is connected to the power supply system 10, the bypass circuit 20, the external power feeding unit 30, and the current measuring unit 32. The power feeding control device 100 executes monitoring and control of each of the battery cells C1 to Cn, switching control of each of the bypass circuits B1 to Bn, and control of the supply voltage from the external power feeding unit 30 to the load L. The power feeding control device 100 of the present embodiment switches each of the bypass circuits B1 to Bn based on the voltage of each of the battery cells C1 to Cn. Further, the power feeding control device 100 of the present embodiment raises and lowers the supply voltage from the external power feeding unit 30 to the load L before and after switching each of the bypass circuits B1 to Bn.

The power feeding control device 100 includes a measured value acquisition unit 101, a discharge completion determination unit 102, a storage unit 103, a bypass control unit 104, and an external power feeding control unit 105.

The measured value acquisition unit 101 is connected to the voltage measuring unit 12, the current measuring units 13 and 32, and the battery temperature measuring unit 14. The measured value acquisition unit 101 acquires measured values from the voltage measuring unit 12, the current measuring units 13 and 32, and the battery temperature measuring unit 14 and stores the measured values in the storage unit 103.

The discharge completion determination unit 102 calculates a remaining amount of each of the battery cells C1 to Cn based on the voltage of each of the battery cells C1 to Cn acquired by the measured value acquisition unit 101 and determines whether the discharge of each of the battery cells C1 to Cn is completed. The discharge completion determination unit 102 of the present embodiment determines whether the voltage of each of the battery cells C1 to Cn acquired by the measured value acquisition unit 101 is dropped to a discharge end voltage.

The storage unit 103 stores the measured value acquired by the measured value acquisition unit 101. Further, the storage unit 103 stores a program executed by the power feeding control device 100.

The bypass control unit 104 controls switching between open and close of the switches S1 and S2 of each of the bypass circuits B1 to Bn according to a determination result of the discharge completion determination unit 102. Specifically, the bypass control unit 104 opens the switch S1 and closes the switch S2 for the bypass circuits B1 to Bn corresponding to the battery cells C1 to Cn which are not determined to be discharged completely by the discharge completion determination unit 102. That is, in this case, the battery cells C1 to Cn are not bypassed. On the other hand, the bypass control unit 104 opens the switch S2 and closes the switch S1 for the bypass circuits B1 to Bn corresponding to the battery cells C1 to Cn which are determined to be discharged completely by the discharge completion determination unit 102. That is, in this case, the battery cells C1 to Cn are bypassed.

The external power feeding control unit 105 controls the supply voltage from the external power feeding unit 30 to the load L according to a determination result of the discharge completion determination unit 102. Specifically, when any of the battery cells C1 to Cn is determined to be discharged completely by the discharge completion determination unit 102, the external power feeding control unit 105 raises the supply voltage from the external power feeding unit 30 to the load L before the battery cells C1 to Cn are switched to the bypass state. Then, the external power feeding control unit 105 lowers the supply voltage from the external power feeding unit 30 to the load L after the switching of the battery cells C1 to Cn to the bypass state is completed.

Figure 2:
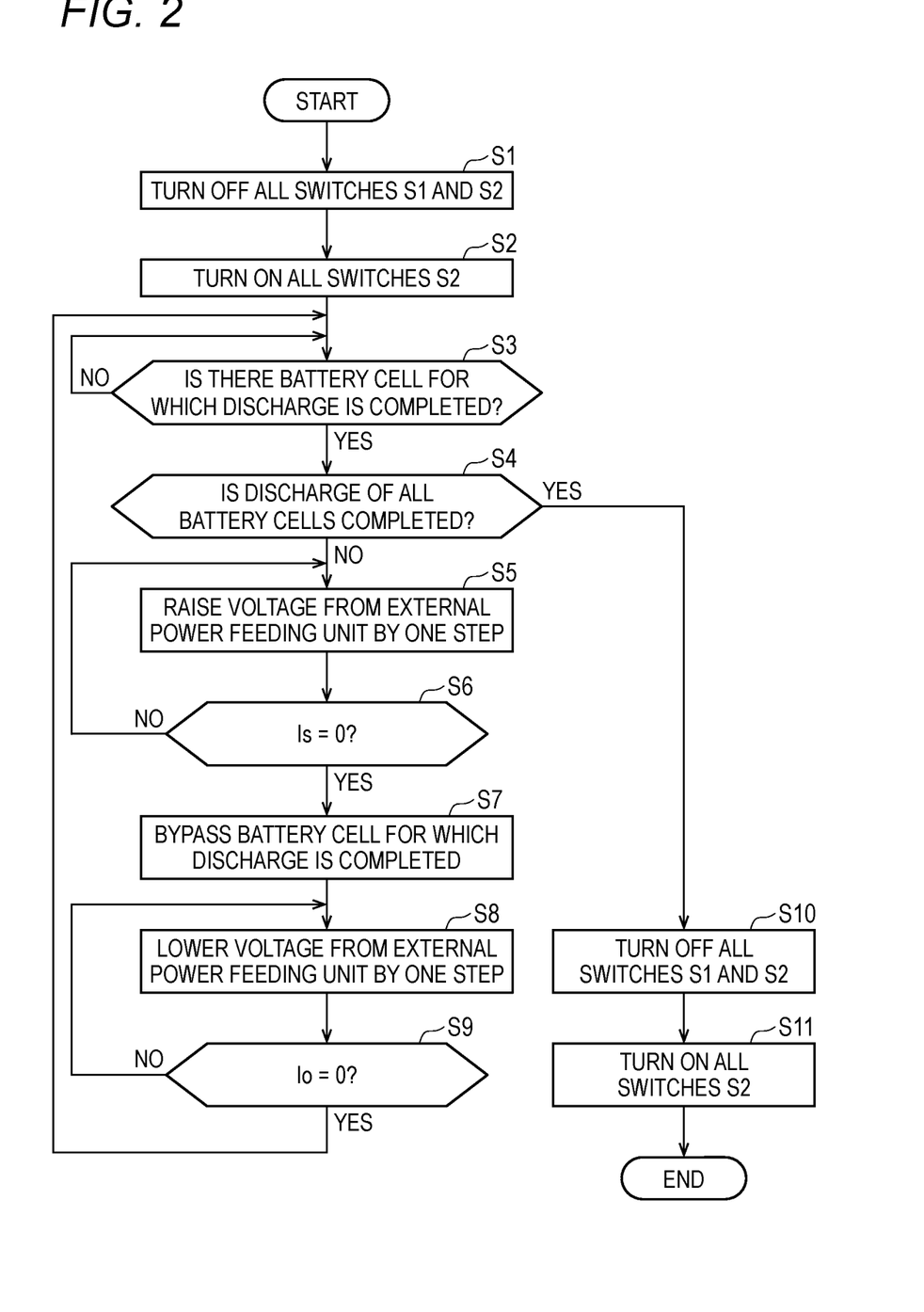
FIG. 2 is a flowchart illustrating power feeding control performing by the power feeding control device shown in FIG. 1.

FIG. 2 is a flowchart illustrating power feeding control by the power feeding control device 100 illustrated in FIG. 1. As illustrated in the flowchart, in Step 1, the bypass control unit 104 opens (OFF) switches S1 and S2 for all bypass circuits B1 to Bn. Next, in Step 2, the bypass control unit 104 closes (ON) the switch S2 for all bypass circuits B1 to Bn. As a result, all battery cells C1 to Cn are discharged.

Next, in Step 3, the discharge completion determination unit 102 determines whether there are the battery cells C1 to Cn whose voltage measured by the voltage measuring unit 12 is equal to or lower than the discharge end voltage, that is, whether there are the battery cells C1 to Cn for which discharge is completed. When an affirmative determination is made in this step, the process proceeds to Step 4, and when a negative determination is made in this step, Step 3 is repeatedly executed.

In Step 4, the discharge completion determination unit 102 determines whether the voltage measured by the voltage measuring unit 12 for all battery cells C1 to Cn is equal to or less than the discharge end voltage, that is, whether the discharge of all battery cells C1 to Cn is completed. If an affirmative determination is made in this step, the process proceeds to Step 10, and when a negative determination is made in this step, the process proceeds to Step 5.

In Step 5, the external power feeding control unit 105 raises the supply voltage from the external power feeding unit 30 to the load L by one step (by a predetermined amount). Next, in Step 6, the external power feeding control unit 105 determines whether or not the current value Is of the supply current measured by the current measuring unit 13 is 0. When an affirmative determination is made in this step, the process proceeds to Step 7, and when a negative determination is made in this step, the process proceeds to Step 5. That is, until the current value Is of the supply current measured by the current measuring unit 13 becomes zero (until the power feeding from the power supply system 10 to the load L is stopped), the external power feeding control unit 105 gradually raises the supply voltage from the external power feeding unit 30 to the load L. Instead of gradually raising the supply voltage from the external power feeding unit 30 to the load L until the current value Is of the supply current measured by the current measuring unit 13 becomes zero, the supply voltage from the external power feeding unit 30 to the load L may be gradually increased until the current value Is measured by the current measuring unit 13 drops to a predetermined value at which it can be determined that the power feeding from the power supply system 10 to the load L is stopped.

In Step 7, the bypass control unit 104 opens the switch S2 and closes the switch S1 for the bypass circuits B1 to Bn corresponding to the battery cells C1 to Cn for which the discharge is completed. Next, in Step 8, the external power feeding control unit 105 lowers the supply voltage from the external power feeding unit 30 to the load L by one step (by a predetermined amount). Next, in Step 9, the external power feeding control unit 105 determines whether or not the current value Io of the supply current measured by the current measuring unit 32 is zero. When an affirmative determination is made in this step, the process proceeds to Step 3, and when a negative determination is made in this step, the process proceeds to Step 8. That is, until the current value Io of the supply current measured by the current measuring unit 32 becomes zero (until the power feeding from the external power feeding unit 30 to the load L is stopped), the external power feeding control unit 105 gradually lowers the supply voltage from the external power feeding unit 30 to the load L.

In Step 4 described above, when the discharge completion determination unit 102 determines that the voltage measured by the voltage measuring unit 12 for all battery cells C1 to Cn is equal to or less than the discharge end voltage, in Step 10, the bypass control unit 104 opens the switches S1 and S2 for all bypass circuits B1 to Bn. That is, the discharge of the power supply system 10 is stopped. Next, in Step 11, the bypass control unit 104 closes the switch S2 for all bypass circuits B1 to Bn. This completes the process.

As described above, in the power feeding control device 100 according to the present embodiment, the supply voltage from the external power feeding unit 30 connected in parallel with the load L to the load L is increased before the switching of the bypass circuits B1 to Bn is started, whereby the power feeding from the power supply system 10 to the load L is stopped and the power is fed from the external power feeding unit 30 to the load L. Then, after the power feeding from the power supply system 10 to the load L is stopped, the bypass circuits B1 to Bn are switched. Then, by lowering the supply voltage from the external power feeding unit 30 to the load L, the power feeding from the power supply system 10 to the load L is restarted. As a result, it is possible to avoid a momentary power failure of the power feeding for the load L when switching of the bypass circuits B1 to Bn is performed.

In the embodiment described above, after switching the bypass circuits B1 to Bn, the supply voltage from the external power feeding unit 30 to the load L is lowered until the current value Io of the supply current from the external power feeding unit 30 to the load L becomes zero. However, not limited to this, after switching the bypass circuits B1 to Bn, the supply voltage from the external power feeding unit 30 to the load L may be lowered until the current value Is of the supply current from the power supply system 10 to the load L rises to a predetermined value.

Further, in the embodiment described above, the battery cells C1 to Cn are connected in series and the bypass circuits B1 to Bn are provided in each of the battery cells C1 to Cn. However, battery packs to which a plurality of battery cells are connected may be connected in series and the bypass circuits B1 to Bn may be provided in each of the battery packs.

Figure 3:
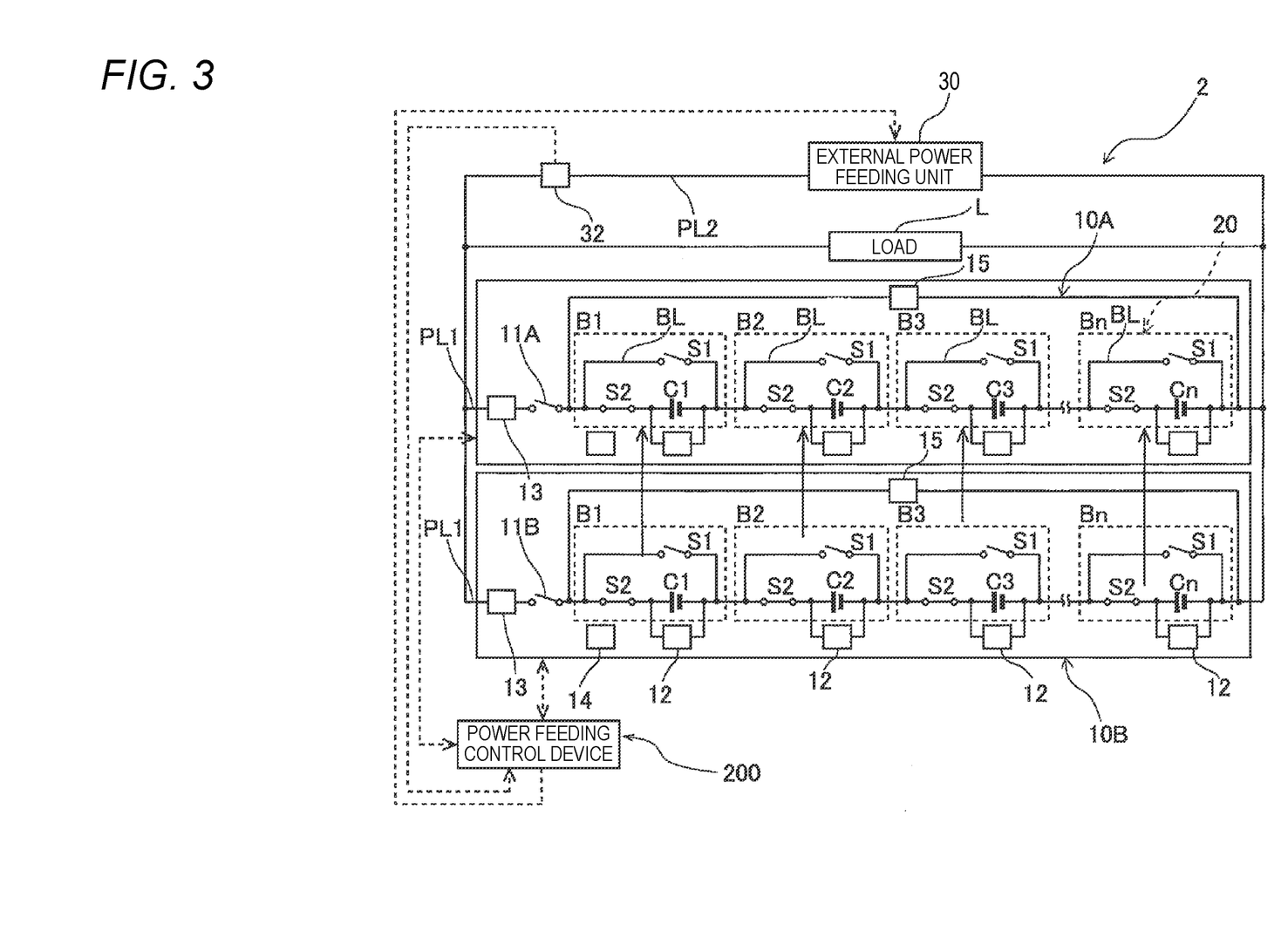
FIG. 3 is a diagram illustrating an outline of a power feeding system including a power feeding control device according to another embodiment of the present invention.

FIG. 3 is a diagram illustrating an outline of a power feeding system 2 including a power feeding control device 200 according to another embodiment of the present invention. The same components as those in the embodiment described above are designated by the same reference numerals and the description of the embodiment described above will be incorporated.

As illustrated in FIG. 3, the power feeding system 2 includes a first power supply system 10A, a second power supply system 10B, the external power feeding unit 30, and the power feeding control device 200. The first power supply system 10A and the second power supply system 10B are in-vehicle or stationary power supplies including n (n is an integer of two or more) battery cells C1 to Cn and n (n is an integer of two or more) bypass circuits B1 to Bn connected in series, respectively. Although not particularly limited, the first power supply system 10A and the second power supply system 10B of the present embodiment are obtained by reproducing the used batteries and there is a difference in the degree of deterioration of the battery cells C1 to Cn. The battery cells C1 to Cn are secondary batteries such as a lithium ion battery and a lithium ion capacitor. The battery cells C1 to Cn are charged by being supplied with electric power from a charging circuit (not illustrated) or the external power feeding unit 30 and discharge the charged electric power to supply electric power to the load L.

The first power supply system 10A and the second power supply system 10B are connected in parallel. The first power supply system 10A includes a first switch 11A and the second power supply system 10B includes a second switch 11B. The first switch 11A is a connection state switching switch which connects or disconnects the first power supply system 10A and the load L and the second switch 11B is a connection state switching switch which connects or disconnects the second power supply system 10B and the load L.

In the power feeding system 2 of the present embodiment, the one having a higher total voltage of the first and second power supply systems 10A and 10B is connected to the load L by the first switch 11A or the second switch 11B, and the one having a lower total voltage of the first and second power supply systems 10A and 10B is disconnected from the load L by the first switch 11A or the second switch 11B. Further, when charging the first and second power supply systems 10A and 10B by a charging circuit (not illustrated) or the external power feeding unit 30, the one having the lower total voltage of the first and second power supply systems 10A and 10B is connected to the charging circuit (not illustrated) or the external power feeding unit 30 by the first switch 11A or the second switch 11B, and the one having the higher total voltage of the first and second power supply systems 10A and 10B is disconnected from the charging circuit (not illustrated) or the external power feeding unit 30 by the first switch 11A or the second switch 11B.

The first power supply system 10A includes a plurality of voltage measuring units 12, the current measuring unit 13, the battery temperature measuring unit 14, and a total voltage measuring unit 15. The current measuring unit 13 included in the first power supply system 10A is provided in the power line PL1 connecting the first power supply system 10A and the load L and measures the current value Is of the supply current from the first power supply system 10A to the load L. Further, the total voltage measuring unit 15 included in the first power supply system 10A measures the total voltage of the first power supply system 10A.

The second power supply system 10B includes the plurality of voltage measuring units 12, the current measuring unit 13, the battery temperature measuring unit 14, and the total voltage measuring unit 15. The current measuring unit 13 included in the second power supply system 10B is provided in the power line PL1 connecting the second power supply system 10B and the load L and measures the current value Is of the supply current from the second power supply system 10B to the load L. Further, the total voltage measuring unit 15 included in the second power supply system 10B measures the total voltage of the second power supply system 10B.

In each of the first and second power supply systems 10A and 10B, the battery cell C1 at the beginning and the battery cell Cn at the end are connected to the load L. When the switch S1 is open and the switch S2 is closed in all bypass circuits B1 to Bn of the first power supply system 10A, electric power is discharged from all battery cells C1 to Cn of the first power supply system 10A to the load L. On the other hand, when the switch S2 is open and the switch S1 is closed in any of the bypass circuits B1 to Bn of the first power supply system 10A, the battery cells C1 to Cn corresponding to the bypass circuits B1 to Bn of the first power supply system 10A are bypassed. Similarly, in the second power supply system 10B, when the switch S1 is open and the switch S2 is closed in all bypass circuits B1 to Bn, electric power is discharged from all battery cells C1 to Cn of the second power supply system 10B to the load L. On the other hand, when the switch S1 is closed and the switch S2 is opened in any of the bypass circuits B1 to Bn of the second power supply system 10B, the battery cells C1 to Cn corresponding to the bypass circuits B1 to Bn of the second power supply system 10B are bypassed.

As will be described below, the external power feeding unit 30 supplies electric power to the load L before and after the connection states of the first and second power supply systems 10A and 10B are switched by the first and second switches 11A and 11B. The current measuring unit 32 measures the current value Io of the supply current from the external power feeding unit 30 to the load L and outputs the current value to the power feeding control device 200.

The power feeding control device 200 is connected to the first and second power supply systems 10A and 10B, the external power feeding unit 30, and the current measuring unit 32. The power feeding control device 200 executes monitoring and control of the first and second power supply systems 10A and 10B, switching control of the first and second switches 11A and 11B, and control of the supply voltage of the external power feeding unit 30. The power feeding control device 200 of the present embodiment switches the states of the first and second switches 11A and 11B based on the total voltage of the first and second power supply systems 10A and 10B. Further, the power feeding control device 200 of the present embodiment raises or lowers the supply voltage from the external power feeding unit 30 to the load L before and after switching of the first and second switches 11A and 11B.

Figure 4:
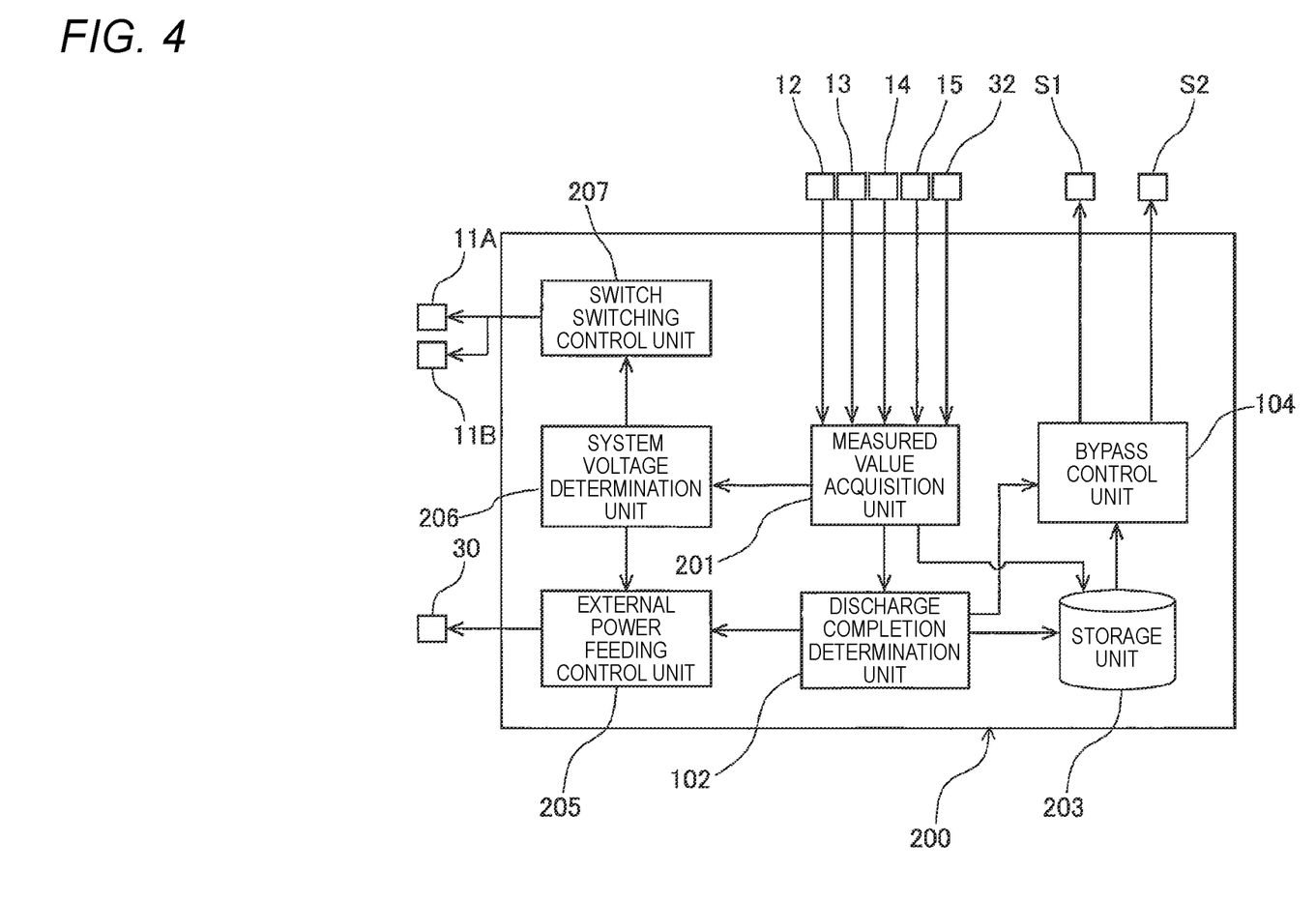
FIG. 4 is a block diagram illustrating a configuration of the power feeding control device shown in FIG. 3.

FIG. 4 is a block diagram illustrating a configuration of the power feeding control device 200 illustrated in FIG. 3. As illustrated in this figure, the power feeding control device 200 executes switching control of the bypass circuits B1 to Bn and control of the external power feeding unit 30 at the time of switching of the bypass circuits B1 to Bn, similarly to the power feeding control device 100 of the embodiment described above. Regarding these controls, the description of the embodiment described above is incorporated.

The power feeding control device 200 includes a measured value acquisition unit 201, the discharge completion determination unit 102, a storage unit 203, the bypass control unit 104, an external power feeding control unit 205, a system voltage determination unit 206, and a switch switching control unit 207.

The measured value acquisition unit 201 is connected to the plurality of voltage measuring units 12, the current measuring units 13 and 32, the battery temperature measuring unit 14, and the total voltage measuring unit 15. The measured value acquisition unit 201 acquires the measured values from the voltage measuring unit 12, the current measuring units 13 and 32, the battery temperature measuring unit 14, and the total voltage measuring unit 15 and stores the measured values in the storage unit 203.

The storage unit 203 stores the measured value acquired by the measured value acquisition unit 201. Further, the storage unit 203 stores a program executed by the power feeding control device 200.

The system voltage determination unit 206 determines which of the total voltage of the first power supply system 10A measured by the total voltage measuring unit 15 included in the first power supply system 10A and the total voltage of the second power supply system 10B measured by the total voltage measuring unit 15 included in the second power supply system 10B is higher.

The switch switching control unit 207 controls switching of the first and second switches 11A and 11B according to a determination result of the system voltage determination unit 206. In particular, when the total voltage of one of the first and second power supply systems 10A and 10B which is connected to the load L is higher than the total voltage of the other of the first and second power supply systems 10A and 10B which is disconnected from the load L, the switch switching control unit 207 does not switch the connection state (open or closed) of the first and second switches 11A and 11B. On the other hand, when the total voltage of one of the first and second power supply systems 10A and 10B which is connected to the load L is lower than the total voltage of the other of the first and second power supply systems 10A and 10B which is disconnected from the load L, the switch switching control unit 207 switches the connection state of the first and second switches 11A and 11B.

The external power feeding control unit 205 controls the supply voltage from the external power feeding unit 30 to the load L according to the determination result of the discharge completion determination unit 102 and the determination result of the system voltage determination unit 206. Regarding the control of the external power feeding unit 30 according to the determination result of the discharge completion determination unit 102, the description of the embodiment described above is incorporated.

When the system voltage determination unit 206 determines that the total voltage of one of the first and second power supply systems 10A and 10B which is connected to the load L is lower than the total voltage of the other of the first and second power supply systems 10A and 10B which is disconnected from the load L, the external power feeding control unit 205 raises the supply voltage from the external power feeding unit 30 to the load L before the connection states of the first and second switches 11A and 11B are switched. Then, the external power feeding control unit 205 lowers the supply voltage from the external power feeding unit 30 to the load L after the switching of the connection states of the first and second switches 11A and 11B is completed. When the timing when it is necessary to switch the bypass circuits B1 to Bn and the timing when it is necessary to switch the connection state of the first and second switches 11A and 11B overlap, one of the switching control of the bypass circuits B1 to Bn and the switching control of the first and second switches 11A and 11B has priority.

Figure 5:
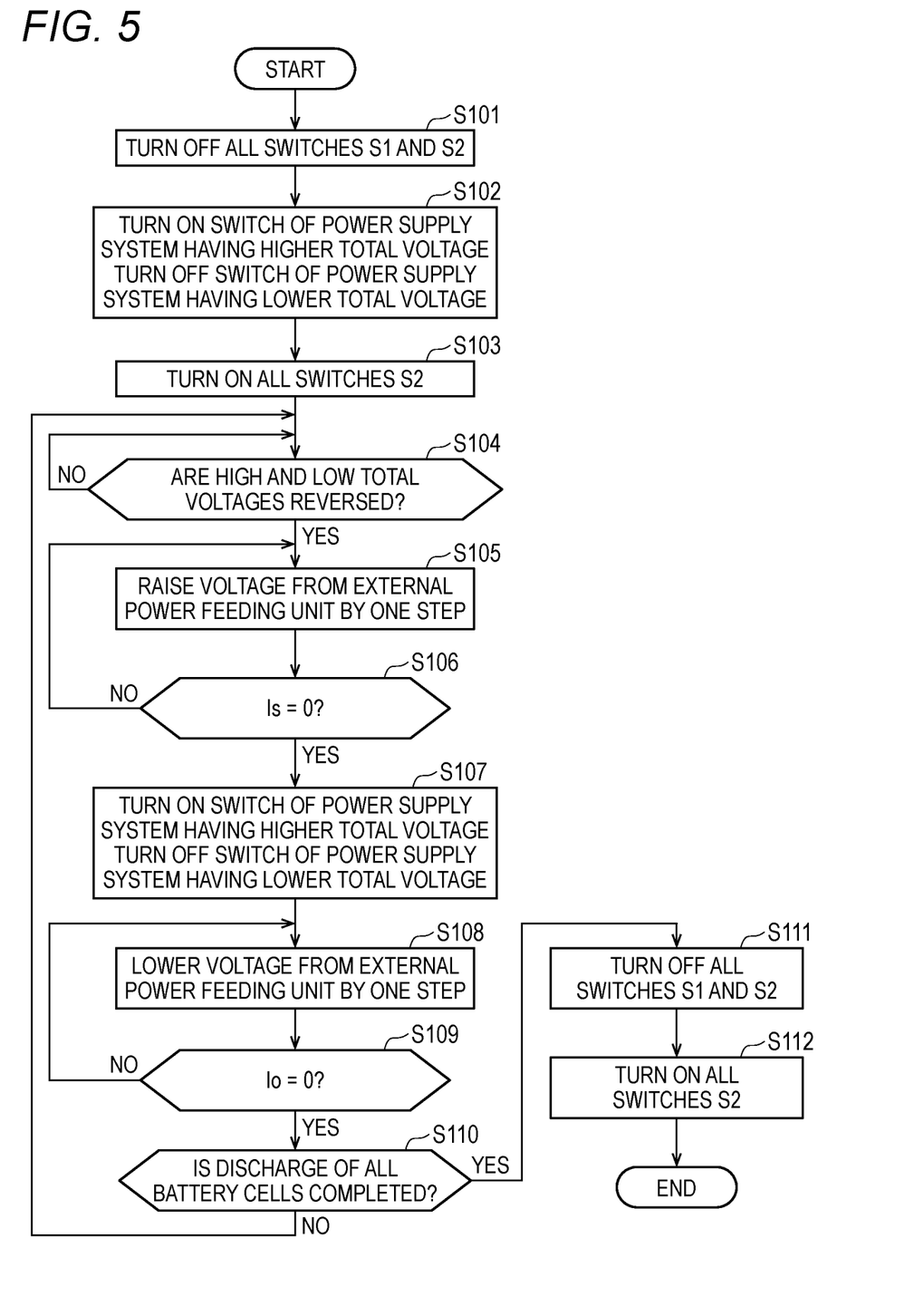
FIG. 5 is a flowchart illustrating power feeding control by the power feeding control device shown in FIG. 4.

FIG. 5 is a flowchart illustrating power feeding control by the power feeding control device 200 illustrated in FIG. 4. Regarding the power feeding control when performing switching of the bypass circuits B1 to Bn, the description of the embodiment described above is incorporated.

As illustrated in the flowchart of FIG. 5, in Step 101, the bypass control unit 104 opens (OFF) all switches S1 and S2 of the first and second power supply systems 10A and 10B. Next, in Step 102, the switch switching control unit 207 reads out the total voltages of the first and second power supply systems 10A and 10B stored in the storage unit 203, and then when the total voltage of the first power supply system 10A is higher than the total voltage of the second power supply system 10B, the first switch 11A is closed (ON) and the second switch 11B is opened (OFF). On the other hand, the switch switching control unit 207 opens the first switch 11A and closes the second switch 11B when the total voltage of the second power supply system 10B is higher than the total voltage of the first power supply system 10A.

Next, in Step 103, the bypass control unit 104 closes (ON) the switch S2 for all bypass circuits B1 to Bn of the first and second power supply systems 10A and 10B. As a result, electric power is discharged from the higher total voltage of the first and second power supply systems 10A and 10B.

Next, in Step 104, the system voltage determination unit 206 determines whether (Are the high and low total voltages of the first and second power supply systems 10A and 10B reversed?) the total voltage of one of the first and second power supply systems 10A and 10B which is disconnected from the load L is lower than the total voltage of the other of the first and second power supply systems 10A and 10B which is connected to the load L. When an affirmative determination is made in this step, the process proceeds to Step 105, and when a negative determination is made in this step, Step 104 is repeatedly executed.

In Step 105, the external power feeding control unit 205 raises the supply voltage from the external power feeding unit 30 to the load L by one step (by a predetermined amount). Next, in Step 106, the external power feeding control unit 205 determines whether the current value Is of the supply current, which is measured by the current measuring unit 13, of one of the first and second power supply systems 10A and 10B which is connected to the load L is zero. When an affirmative determination is made in this step, the process proceeds to Step 107, and when a negative determination is made in this step, the process proceeds to Step 105. That is, until the current value Is of the supply current measured by the current measuring unit 13 becomes zero (until the power feeding from one of the first and second power supply systems 10A and 10B to the load L is stopped), the external power feeding control unit 205 gradually raises the supply voltage from the external power feeding unit 30 to the load L.

In Step 107, the switch switching control unit 207 opens (OFF) the switch (first switch 11A or second switch 11B) of one of the first and second power supply systems 10A and 10B which is connected to the load L and closes (ON) the switch of the other. Next, in Step 108, the external power feeding control unit 105 lowers the supply voltage from the external power feeding unit 30 to the load L by one step (by a predetermined amount). Next, in Step 109, the external power feeding control unit 105 determines whether the current value Io of the supply current measured by the current measuring unit 32 is zero. When an affirmative determination is made in this step, the process proceeds to Step 110, and when a negative determination is made in this step, the process proceeds to Step 108. That is, until the current value Io of the supply current measured by the current measuring unit 32 becomes zero (until the power feeding from the external power feeding unit 30 to the load L is stopped), the external power feeding control unit 205 gradually lowers the supply voltage from the external power feeding unit 30 to the load L.

In Step 110, the discharge completion determination unit 102 determines whether the voltage measured by the voltage measuring unit 12 for all battery cells C1 to Cn of the first and second power supply systems 10A and 10B is equal to or less than the discharge end voltage. When an affirmative determination is made in this step, the process proceeds to Step 111, and when a negative determination is made in this step, the process proceeds to Step 104.

In Step 111, the bypass control unit 104 opens (OFF) the switches S1 and S2 for all bypass circuits B1 to Bn of the first and second power supply systems 10A and 10B. Next, in Step 112, the bypass control unit 104 closes (ON) the switches S2 for all the bypass circuits B1 to Bn of the first and second power supply systems 10A and 10B. This completes the process.

As described above, in the power feeding control device 100 according to the present embodiment, by increasing the supply voltage from the external power feeding unit 30 connected in parallel with the load L to the load L before the start of switching of the first and second switches 11A and 11B, the power feeding to the load L from one of the first and second power supply systems 10A and 10B is stopped and the power is fed from the external power feeding unit 30 to the load L. Then, after the power feeding to the load L from one of the first and second power supply systems 10A and 10B is stopped, switching of the first and second switches 11A and 11B is performed. Then, by lowering the supply voltage from the external power feeding unit 30 to the load L, power feeding to the load L from the other of the first and second power supply systems 10A and 10B is started. As a result, it is possible to avoid a momentary power failure of power feeding to the load L when the connection states of the first and second power supply systems 10A and 10B are switched by the first and second switches 11A and 11B.

In the embodiment described above, the connection states of the first and second power supply systems 10A and 10B are switched based on the total voltages of the first and second power supply systems 10A and 10B. However, the connection state of the first and second power supply systems 10A and 10B may be switched based on the total circuit voltage or the total charge rate of the first and second power supply systems 10A and 10B.

The present invention is described above based on the embodiments. However, the present invention is not limited to the embodiments described above and changes may be made without departing from the spirit of the present invention, or publicly known or well-known techniques may be combined as appropriate.

In the power feeding control device of the present invention, the plurality of power supplies may be formed by connecting a plurality of unit batteries or assembled batteries in series and the connection state switching unit may be a bypass circuit which bypasses each of the plurality of unit batteries or assembled batteries.

In the power feeding control device of the present invention, the plurality of power supplies may be connected in parallel and the connection state switching unit may include a switch for connecting or disconnecting each of the plurality of power supplies and the load.

In the power feeding control device of the present invention, before the connection state switching unit starts switching of the connection state between each of the plurality of power supplies and the load, the supply voltage from the external power feeding unit to the load may be increased until a current value of supply current from the plurality of power supplies to the load becomes zero, or until the current value of the supply current from the plurality of power supplies to the load is lowered to a predetermined value and the connection state switching unit may switch the connection state between each of the plurality of power supplies and the load after the current value of the supply current from the plurality of power supplies to the load becomes zero, or after the current value of the supply current from the plurality of power supplies to the load is lowered to the predetermined value.

In the power feeding control device of the present invention, after the connection state switching unit switches the connection state between each of the plurality of power supplies and the load, the supply voltage from the external power feeding unit to the load may be reduced until a current value of supply current from the external power feeding unit to the load becomes zero, or until the current value of the supply current from the plurality of power supplies to the load rises to a predetermined value.

According to the present invention, the supply voltage from the external power feeding unit connected in parallel with a load to the load is increased before the start of switching of the connection states of the plurality of power supplies and the supply voltage from the external power feeding unit to the load is reduced after switching of the connection states of the plurality of power supplies. As a result, power feeding to the load can be continued even when the connection state of the plurality of power supplies is switched.

What is claimed is:

1. A power feeding control device which controls a power feeding system including a plurality of power supplies feeding power to a load, a connection state switching unit which connects or disconnects each of the plurality of power supplies and the load individually, and an external power feeding unit which is connected in parallel with the load and feeds power to the load, wherein
supply voltage from the external power feeding unit to the load is increased before the connection state switching unit starts switching of a connection state between each of the plurality of power supplies and the load, and
the supply voltage from the external power feeding unit to the load is decreased after the connection state switching unit switches the connection state between each of the plurality of power supplies and the load, and
wherein
before the connection state switching unit starts switching of the connection state between each of the plurality of power supplies and the load, the supply voltage from the external power feeding unit to the load is increased until a current value of supply current from the plurality of power supplies to the load becomes zero, or until the current value of the supply current from the plurality of power supplies to the load is lowered to a predetermined value, and
after the current value of the supply current from the plurality of power supplies to the load becomes zero, or after the current value of the supply current from the plurality of power supplies to the load is lowered to the predetermined value, the connection state switching unit switches the connection state between each of the plurality of power supplies and the load.

2. The power feeding control device according to claim 1, wherein
after the connection state switching unit switches the connection state between each of the plurality of power supplies and the load, the supply voltage from the external power feeding unit to the load is reduced until a current value of supply current from the external power feeding unit to the load becomes zero, or until the current value of the supply current from the plurality of power supplies to the load rises to the predetermined value.

3. A power feeding system comprising:
a plurality of power supplies feeding power to a load;
a connection state switching unit configured to selectively connect or disconnect each of the plurality of power supplies and the load individually;

an external power feeding unit which is connected in parallel with the load and feeds power to the load; and a power feeding control device which controls power feeding from the plurality of power supplies to the load and power feeding from the external power feeding unit to the load, wherein the power feeding control device raises supply voltage from the external power feeding unit to the load before the connection state switching unit starts switching of a connection state between each of the plurality of power supplies and the load, wherein the power feeding control device lowers the supply voltage from the external power feeding unit to the load after the connection state switching unit switches the connection state between each of the plurality of power supplies and the load, and wherein:

before the connection state switching unit starts switching of the connection state between each of the plurality of power supplies and the load, the supply voltage from the external power feeding unit to the load is increased until a current value of supply current from the plurality of power supplies to the load becomes zero, or until the current value of the supply current from the plurality of power supplies to the load is lowered to a predetermined value, and after the current value of the supply current from the plurality of power supplies to the load becomes zero, or after the current value of the supply current from the plurality of power supplies to the load is lowered to the predetermined value, the connection state switching unit switches the connection state between each of the plurality of power supplies and the load.

4. A power feeding control method which is performed using a power feeding control device for controlling a power feeding system, the power feeding system including a plurality of power supplies feeding power to a load, a connection state switching unit configured to selectively connect or disconnect each of the plurality of power supplies and the load individually, and an external power feeding unit which is connected in parallel with the load and feeds power to the load, the power feeding control method comprising:

increasing supply voltage from the external power feeding unit to the load before the connection state switching unit starts switching of a connection state between each of the plurality of power supplies and the load, and decreasing the supply voltage from the external power feeding unit to the load after the connection state switching unit switches the connection state between each of the plurality of power supplies and the load, wherein:

increasing supply voltage from the external power feeding unit to the load until a current value of supply current from the plurality of power supplies to the load becomes zero, or until the current value of the supply current from the plurality of power supplies to the load is lowered to a predetermined value before the connection state switching unit starts switching of the connection state between each of the plurality of power supplies and the load, and switching the connection state between each of the plurality of power supplies and the load by the connection state switching unit after the current value of the supply current from the plurality of power supplies to the load becomes zero, or after the current value of the supply current from the plurality of power supplies to the load is lowered to the predetermined value.

5. A non-transitory computer readable storage medium in which a program is stored to cause a computer to execute each step that is included in the power feeding control method according to claim 4.

* * * * *